United States Patent [19]

Yamazaki

[11] Patent Number: 5,139,970
[45] Date of Patent: Aug. 18, 1992

[54] ELECTRIC DEVICE AND MANUFACTURING METHOD OF THE SAME

[75] Inventor: Shunpei Yamazaki, Tokyo, Japan

[73] Assignee: Semiconductor Energy Laboratory Co., Ltd., Kanagawa, Japan

[21] Appl. No.: 696,968

[22] Filed: May 8, 1991

Related U.S. Application Data

[62] Division of Ser. No. 513,870, Apr. 24, 1990, Pat. No. 5,036,373.

[30] Foreign Application Priority Data

Jun. 1, 1989 [JP] Japan ................... 1-140527
Jun. 1, 1989 [JP] Japan ................... 1-140528

[51] Int. Cl.$^5$ ........................................... H01L 21/44
[52] U.S. Cl. ........................................ 437/184; 437/4; 437/5; 156/645
[58] Field of Search ................. 437/184, 4, 5, 977, 437/939; 156/645

[56] References Cited

U.S. PATENT DOCUMENTS

| | | | |
|---|---|---|---|
| 4,554,727 | 11/1985 | Deckman et al. | 437/977 |
| 4,786,607 | 11/1988 | Yamazaki et al. | 437/4 |
| 4,901,133 | 2/1990 | Curran et al. | 357/59 |
| 4,949,154 | 8/1990 | Haken | 357/52 |
| 4,968,354 | 11/1990 | Nishiura et al. | 437/4 |
| 5,055,416 | 10/1991 | Weber | 437/4 |

Primary Examiner—Brian E. Hearn
Assistant Examiner—K. Picardat
Attorney, Agent, or Firm—Sixbey, Friedman, Leedom & Ferguson

[57] ABSTRACT

An electric device comprises a crystalline film deposited on a substrate and an electrode formed on the film. The crystalline film consists of a number of colomnar crystals grown at right angles from the surface of the substrate. There are many grain boundaries passing through the crystalline film from the substrate surface to the electrode. The direct contact between the electrode and the grain boundaries is prevented by means of an insulating coating applied only to the portion of surfaces of the columnar crystals where the boundaries appear.

14 Claims, 3 Drawing Sheets

ELECTRIC DEVICE AND MANUFACTURING METHOD OF THE SAME

This is a divisional application of Ser. No. 513,870, filed Apr. 24, 1990, now U.S. Pat. No. 5,036,373.

BACKGROUND OF THE INVENTION

1. Field of the Invention

The present invention relates to electric devices and a method of manufacturing the devices and, more particularly to electric devices and a manufacturing method utilizing crystalline films such as light emitting devices.

2. Description of the Prior Art

For emission of reddish light rays, GaAs semiconductors have been utilized to manufacture light emitting devices for more than a decade. The emission of blue or green light, as well as white light, however, has long been hardly realized by means of solid state devices.

The inventor has before proposed to make a light emitting device from diamond which can emit light at short wave lengths, for example, as described in Japanese Patent Application No sho 56-146930 filed on Sep. 17, 1981. Diamond is promissing, as a light emitting substance for mass production, because of its high thermal resistance, cheminally stabilities and low price, in view of a great demand for light emitting devices in the market. It is, however, very difficult to manufacture diamond light emitting devices at a high yield required for commercialization because there are formed a large proportion of products whose efficiencies are undesirably too low to satisfy the requirement of the application thereof. Furthermore, the performance of prior art diamond devices tend to quickly age by actual operation. For example, prior art diamond light emitting devices were heated up to 50° C. only by application of 30 V for 10 min and the performances were then significantly degraded.

BRIEF SUMMARY OF THE INVENTION

It is an object of the present invention to provide an electric device with a crystalline film having a high performance just expected from nature of the crystalline film.

It is another object of the present invention to provide a method of manufacturing electric devices in a high yield in production.

Additional objects, advantages and novel features of the present invention will be set forth in the description which follows, and in part will become apparent to those skilled in the art upon examination of the following or may be learned by practice of the present invention. The object and advantages of the invention may be realized and attained by means of the instrumentalities and combinations particularly pointed out in the appended claims.

The present invention has been culminated based upon the discovery of the origin of the low yield of diamond light emitting device manufacture. The light emitting action of diamond light emitting devices takes place when a relatively large current is passed through diamond crystals by applying a voltage between a pair of electrodes sandwiching the diamond crystals. The electric energy carried by the current, however, is consumed largely only to produce heat rather than to emit light rays. The inventor successed in the discovery of the origin of the low efficiencies and the heat generation. As a result, the following fact has been found.

When deposited, diamond tends to form a polycrystalline film 2 composed of columnar crystals 2 grown at right angles on a substrate as illustrated in FIG. 1. There are formed many grain boundaries 4 extending through the diamond film 2. It was found by Raman spectroscopic analysis that these grain boundaries consists of segregation of carbon graphite which has a resistivity substantially lower than that of diamond crystals, e.g. by a factor of $10^2 \sim 10^4$. Furthermore, these boundaries tend to gather metallic ions occuring inadvertently in the film 5. The metallic ions also function to elevate the conductivity of the boundaries. Because of this, a large proportion of current flows across the film along the boundaries rather than through the diamond crystals. It is for this reason that prior art diamond electric devices can not exhibit sufficient performances which are inherently expected from the characteristics of diamond itself. For example, the current passing through the boundaries has no contribution to light emitting but only function to generate heat.

Another origin of heat generation is existence of pinholes 5 passing through the film 2 which are undesirably but often formed during deposition. When an upper electrode 3 is deposited, short current passages are formed undesirably.

To achieve the foregoing and other object, and in accordance with the present invention, as embodied and broadly described herein, it is avoided to form graphite paths which bypass diamond crystals and conceal the inherent electric characteristics of diamond. The present invention utilizes the fact that diamond films are deposited with grain boundaries exposed on the perimeters of the crystals which are recessed from the center top surfaces of the columnar crystals. These recesses are filled with and insulated by an insulating material such as a photoresist or a molten glass, e.g. molten $SiO_2$ doped with boron or phosphorus. The insulated material prevents an upper electrode fromed on the diamond film from being in contact with the graphite material in the boundaries.

By this structure, the electrode makes electrical contact only with diamond crystals and therefore current passes through the insides of the crystals. The current induces recombination of electron-hole pairs between mid-gap states (radiation centers), between the mid-gap states and a valence band, between a conduction band and the mid-gap states and between the conduction band and the valence band. The spectrum of light emitted from a diamond film is determined by differential energy levels between the mid-gap states, the bottom of the conduction band and the apex of the valence band. Depending upon the differential levels, it is possible to emit blue or green light or radiation having continuous spectrum of wavelengths over a relatively wide range such as white light.

The above discussion can be applied for general natures of crystalline films consisting of columnar crystals, and therefore the present invention has general applicability to other crystalline material than diamond.

BRIEF DESCRIPTION OF THE DRAWINGS

The accompanying drawings, which are incorporated in and form a part of the invention and, together with the description, serve to explain the principles of the invention.

DETAILED DESCRIPTION OF THE PREFERRED EMBODIMENTS

Figure 2A:
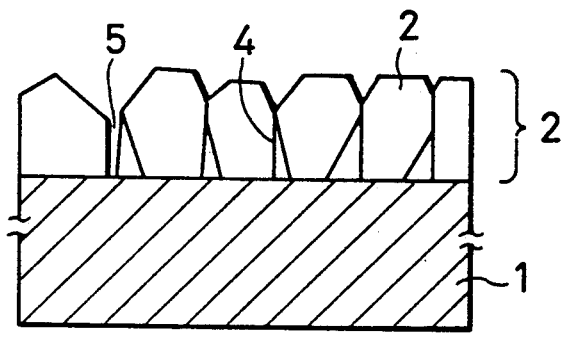
FIGS. 2(A) to 2(C) are cross sectional views showing a method of manufacturing diamond light emitting devices in accordance with a first embodiment of the present invention.
Figure 2B:
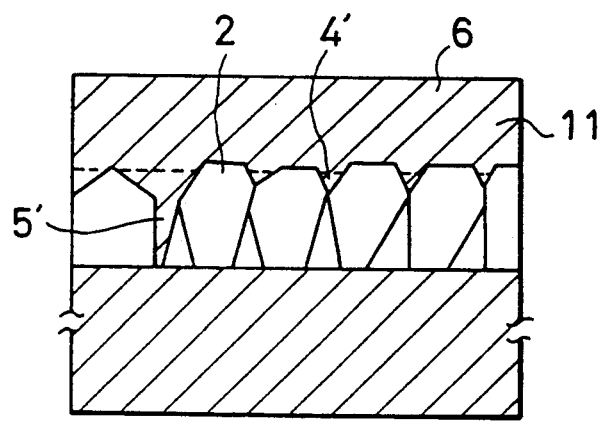
Figure 2C:
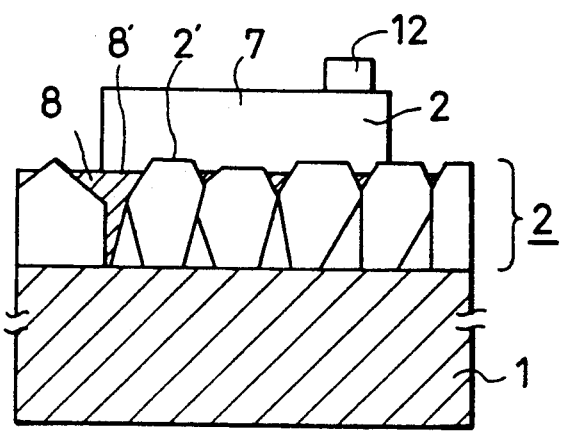

Referring now to FIGS. 2(A) to 2(C), a method of forming a light emitting device in accordance with a first embodiment of the invention will be explained. A diamond coating 2 is deposited on a single crystalline silicon semiconductor substrate 1 to a thickness of 0.5 to 3.0 micrometers, e.g. 1.3 micrometers, by a known microwave-assisted plasma CVD method in a magnetic field. The CVD methods of such a type include ECR CVD or MCR CVD as described in Japanese Patent Application No. sho 61-292859 filed on Dec. 9, 1986 and U.S. patent application No. 07/178,362 of the applicant. The substrate 1 has been heavily doped with boron ions in order to be a p-type impurity semiconductor substrate having a low resistivity. The surface of the substrate to be coated is finely scratched by putting it in a liquid in which diamond fine particles are dispersed and applying ultrasonic waves thereto for 10 min to 1 hour. The scratchs form focuses on the surface of the substrate for growing diamond crystals therefrom.

The microwave CVD process of the diamond film is carried out in a plasma CVD chamber provided with a microwave oscillator capable of emitting microwaves at 2.45 GHz at a maximum output power of 10 KW and a pair of Helmholtz coils. The coils are energized during the deposition to induce a magnetic field having a maximum strength of 2 K Gauss and a resonating strength of 875 Gauss at the surface of the substrate to be coated. The deposition of the carbon coating will be carried out in accordance with the following procedure.

The scratched substrate is disposed in the chamber in order to experience the magnetic field of 755 Gauss. After evacuating the inside of the chamber to $10^{-3}$ to $10^{-8}$ Torr, a reactive gas is introduced to a pressure of 0.01 to 50 Torr, e.g. 0.1 Torr. The reactive gas comprises an alcohol such as methyl alcohol ($CH_3OH$) or ethyl alcohol ($C_2H_5OH$) diluted with hydrogen at 1 to 15 vol %, e.g. 5 vol %. Then, microwaves are applied at 2.45 GHz in the direction parallel to the direction of the magnetic field to cause ionized particles of the reactive gas in the form of plasma to resonate therewith in the magnetic field. As a result, a number of columnar crystals 21' of diamond grow on the substrate. During the deposition of diamond crystals, carbon graphite is also deposited. However, the graphite, which is relatively chemically unstable as compared with diamond, reacts with oxygen and hydrogen ions which also occur in the plasma of the alcohol and removed from the deposited film in the form of gases, i.e. carbon dioxide or methane. The graphite then occurs only in the grain boundaries between the diamond crystals.

The deposited carbon film eventually includes a number of grain boundaries 4 and some pinholes 5. It should be noted that grain boundaries extend upward from the substrate and terminate in recesses located between adjacent crystals 2' at the film surface. In accordance with the present invention, these recesses and pinholes are filled with an insulating material. Namely, a positive photoresist 6 is coated on the diamond film 2 by a spin coating method. The photoresist is preferably chosen from transparent photoresists such as OFPR 800-60CP having a viscosity of rank C which is diluted four times by a thinner to have an appropriate viscosity. The photoresist is then baked at 80° C. for 20 min and exposed to ultraviolet light illumination from the upper side at 2 mW/cm$^2$ for about 6 seconds. The duration of this exposure to illumination is precisely adjusted in order to develop the photoresist only to a level designated by numeral 11 from the upper surface thereof (FIG. 2(B)). Namely, the photoresist is only developed to a plane which is perpendicular and slightly lower than the top surface of the diamond crystals, leaving the portion below the plane undeveloped filling the pinholes 5' and the recesses 4'. The developed portion of the photoresist is removed by a solution (NMD-3). The undeveloped portion is left as it is or by thermally cured (hardened) if necessary.

By this procedure, the pinholes and the grain boundaries are hidden from the upper side surface of the diamond film while the top surface of the diamond crystals are left exposed. The upper surface of the film 2 is then coated with an upper electrode 7 made of indium tin oxide (ITO) in direct electrical contact with the diamond crystals. The electrode 7, however, shall not make direct contact with the pinholes 5 or the grain boundaries 4 by virtue of the photoresist. On the electrode 7 is formed a lead electrode 12 which is made from a multilayered film consisting of alminum, silver and/or molibdenum films. The lead electrode 12 may be formed by an alminum film alone or a dual film consisting of an upper cromium or molibdenum film and a lower alminum film coated thereon. The upper cromium or molibdenum film is high heat-resistant and has a high stability while the lower alminum film is suitable for wire bonding. As a result, a light emitting device with a light emitting area of 1 to 10 mm square e.g. 3 mm square is formed.

When a voltage of 10 to 200 V (e.g. 60 V) was applied across the diamond film 5 of a diamond light emitting device formed in accordance with the above procedure by means of the upper electrode 7 and the substrate 1 functioning as the counterpart lower electrode, diamond emitted green visual light at 12 cd/m$^2$ by virtue of current passing therethrough. The voltage may be applied as a DC voltage or as a pulse train at 100 Hz of a duty ratio of 50%. The illumination was not appreciably reduced even when application of 60 V was continued for a month.

Figure 1:
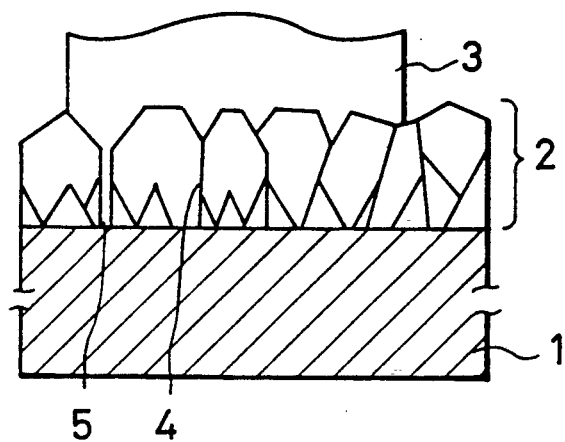
FIG. 1 is a cross sectional view showing a prior art diamond light emitting device.
Figure 3:
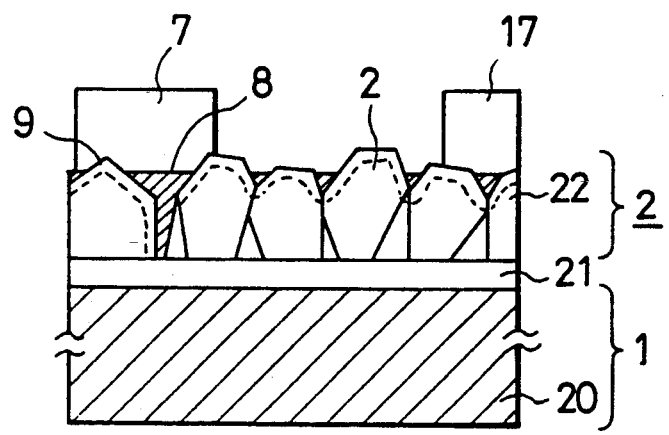
FIG. 3 is a cross sectional view showing a diamond light emitting device in accordance with a second embodiment of the present invention.

Referring now to FIG. 3, a second embodiment of the present invention will be described. The upper surface of a single crystalline silicon semiconductor substrate 20 is insulated by coating of a silicon nitride film of 0.5 to 1 micrometer thickness. On the insulated surface, a diamond film is deposited to a thickness of 0.5 to 3 micrometers, e.g. 1.2 micrometers in the same manner as the film 2 of the first embodiment. The upper surface of the diamond film 2 is given fine scratchs in the same manner as the substrate 1 of the first embodiment is given. The scratched surface is schematically shown with broken line 22. The scratchs form a number of recombination centers (light emitting centers) on the surface of the film 2. The filling procedure of recesses and pinholes with a photoresist 8 is same as that of the first embodiment. A pair of electrodes 7 and 17 are formed on the upper surface of the substrate in order to pass current parallel to the surface. When a 40 V was applied between the electrodes of a light emitting device formed by this procedure, 6 cd/cm$^2$ light emission was observed.

Figure 4:
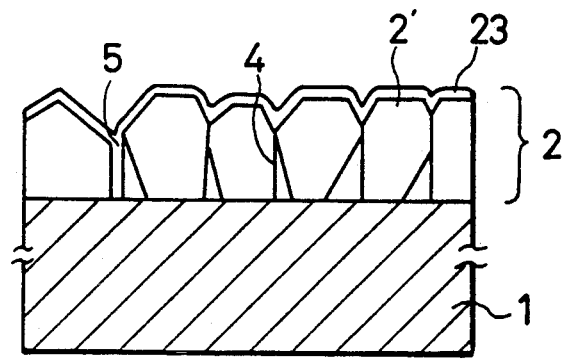
FIGS. 4(A) to 4(D) are cross sectional views showing a light emitting device in accordance with a third embodiment of the present invention.
Figure 4:
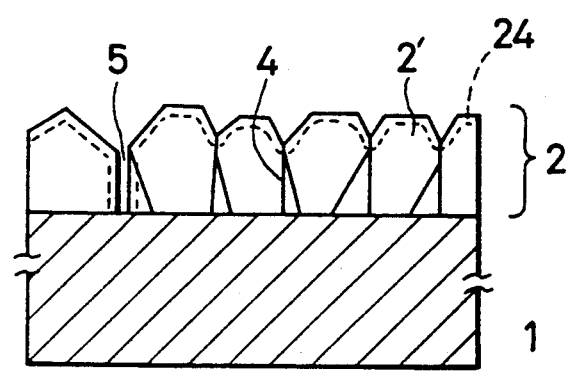
Figure 4:
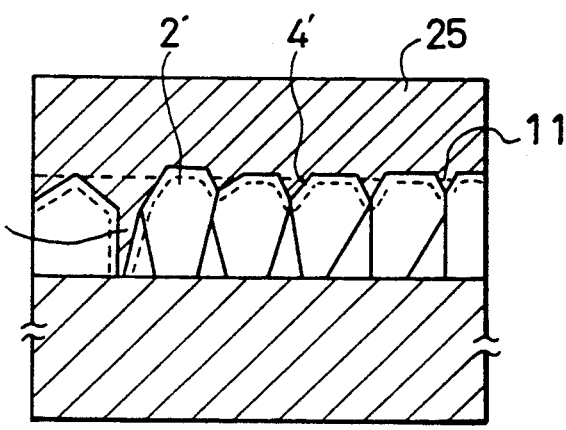
Figure 4:
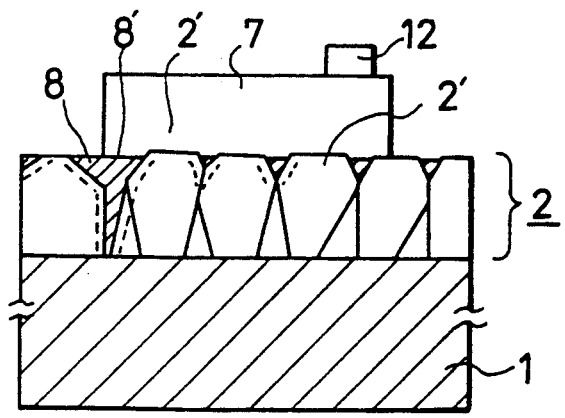

Referring now to FIGS. 4(A) to 4(D), a third embodiment of the present invention will be explained. Similar numerals are used for designating corresponding parts as those used in FIGS. 2(A) to 2(C) and redundant explanations therefore will not be repeated. After a diamond film 2 is deposited on a semiconductor substrate 2 in the same manner as in the first embodiment, a silicon film 23 is deposited to a thickness of 300 to 3000 angstroms over the upper surface of the diamond film by decomposition of disilane or monosilane in the same chamber as the diamond film. The silicon film 23 is then heated at 500° to 1000° C. in a hydrogen atmosphere to form a silicon carbide coating 24 on the upper surface of the diamond film through alloying reaction between the diamond films 2 and the silicon film 23 as illustrated in FIG. 4(B).

The upper surface of the diamond film 2 provided with the silicon carbide film 24 is coated next with an organic glass such as $(CH_3)_3OH$ and $(C_2H_5)_4O_4Si$ by a spin coating method as shown in FIG. 4(C). The organic component of the glass coating is driven off by heating it at 200° to 500° C., e.g. 400° C. in order to solidify the coating. In this way, the upper surface of the diamond film 2 is covered with an inorganic glass film 25. A portion of the glass film no lower than the top surfaces of the diamond crystals is removed by etching for the same purpose as in the first embodiment. An upper electrode 7 and a lead electrode 12 are formed on the exposed upper surface of the diamond film 2 in the same manner as the first embodiment. In this embodiment, undesirable reaction between the inorganic glass and the diamond is prevented by means of the intervening silicon carbide coating 24 and a long-term reliability can be obtained. Of course, a similar structure can be formed with an insulating substrate and a pair of upper electrodes as described in FIG. 3.

Similar electric devices can be formed by use of crystalline boron nitride films instead of diamond film in accordance with any above embodiments in the same manner. The method and structure are substantially same as described above except particularly provided in this paragraph. In this case, suitable substrates to be coated with crystalline boron nitride films are made from, for example, beryllium nitride, diamond, a silicon semiconductor, or any other pane whose surface is insulated by an insulating material such as amorphous boron nitride in advance. The suitable reactive gases are, for example; boron source gases such as diborane ($B_2H_6$), boron fluoride ($BF_3$), organic boron compounds, methylboron ($B(CH_3)_3$) and nitrogen source gas such as ammonia ($NH_3$), nitrogen ($N_2$), nitrogen fluoride ($NF_3$). The boron source gases and the nitrogen source gases are used in combination. Some gaseous compounds such as borofluoric ammonium ($NH_4BF_4$) have both functions of the boron and nitrogen sources and can be used alone. The pressure of reactive gases during deposition is 0.01 to 10 Torr, typically 0.1 to 1 Torr, e.g. 0.26 Torr. The input power of microwaves is 2 to 10 KW. The thickness of crystalline boron nitride film consisting of columnar crystals is 0.5 to 5 micrometers, e.g. 1.3 micrometers on the average. The substrate temperature is 400° to 1200° C., e.g. 1000° C. Other conditions are same as used in the above embodiments. Of course, crystalline diamond films and crystalline boron nitride films can be used in combination to form multilayered films.

The foregoing description of the preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated. Although the photoresist is positive in the first and second embodiments, a negative photoresist can be used when the electric device is constructed on a transparent substrate. In this case, the negative photoresist is cured by illumination effected from the substrate side.

The present invention is broadly applicable to any electric device which utilizes a polycrystalline film since the principle is based only upon the general feature of deposited crystalline film including grain boundaries. These electric devices can be formed on a single substrate, i.e. an integrated circuit device which may consists of diamond light emitting devices, diamond diodes, diamond transistors, diamond resistances, diamond capacitors and the like. Of course, it is possible to severe a single substrate, after a number of diamond devices are formed on the substrate, into indivisual separate devices.

What is claimed is:

1. A method of forming electric device comprising:
   forming on a substrate a polycrystalline film of at least one of diamond or boron nitride having pinholes passing therethrough;
   filling said pinholes with an insulating material; and
   forming an electrode pattern directly on said film,
   wherein said electrode pattern is insulated from said pinholes by means of said insulating material.

2. A method of forming electric device comprising:
   preparing diamond and/or boron nitride;
   providing said diamond and/or boron nitride with recombination centers by scratching a surface of said diamond and/or boron nitride; and
   forming an electrode pattern on a surface of said diamond and/or boron nitride.

3. The method of claim 2 wherein said recombination centers are light emitting centers.

4. The method of claim 2 wherein the scratch of said surface is carried out by putting said diamond and/or boron nitride in a liquid in which diamond fine particles are dispersed and applying ultrasonic waves thereto.

5. The method of claim 2 wherein said diamond is a diamond film formed on a substrate.

6. A method of forming electric device comprising:
   growing columnar crystals made from diamond or boron nitride on a substrate in the form of crystalline layer;
   coating an insulating material on said layer in order that only the top surfaces of said columnar crystals are exposed and that spaces between adjacent crystals are filled with said insulating material; and
   forming an electrode arrangement on said layer in contact with the top surfaces of said crystals and said insulating coating.

7. A method of claim 6 wherein said coating procedure comprises the steps of coating a photoresist film on said crystalline layer, curing said photoresist film by illumination to a plane parallel to the lower electrode and slightly lower than top surfaces of said columnar crystals and removing a portion of the photoresist film which is located higher than said plane.

8. The method of claim 6 wherein said photoresist is positive and said illumination is effected from the upper side.

9. The method of claim 6 wherein said insulating coating is an inorganic glass formed by applying an organic glass coating to said crystalline layer and removing the organic component of said organic glass by thermal treatment.

10. The method of claim 9 wherein said crystalline layer is treated by silicon in advance of formation of said insulating coating in order to form silicon carbide between said crystalline layer and said insulating coating.

11. The method of claim 6 further comprising a step of scratching, in advance of formation of said crystalline layer, said substrate in order to form fine scratches which function as focusses of the growth of said columnar crystals.

12. The method of claim 6 wherein said columnar crystals are grown by chemical vapor deposition.

13. The method of claim 12 wherein said chemical vapor deposition is carried out by use of a reactive gas selected from the group consisting of $B_2H_6$, $BF_3$, organic boron compounds, $B(CH_3)_3$, $NH_3$, $N_2$, $NF_3$, and $NH_4BF_4$ in order to grow boron nitride columnar crystals.

14. A method of forming an electric device comprising:
  forming on a substrate a polycrystalline film having pinholes passing therethrough and recesses at grain boundaries between adjacent crystals of the film;
  at least partially filling said pinholes and recesses with an insulating material; and
  forming an electrode pattern directly on said film,
  wherein said electrode pattern is insulated from said pinholes and said grain boundaries by means of said insulating material.

* * * * *